United States Patent [19]

Warwick

[11] 4,021,838
[45] May 3, 1977

[54] SEMICONDUCTOR INTEGRATED CIRCUIT DEVICES

[75] Inventor: William Arthur Warwick, Winchester, England

[73] Assignee: International Business Machines Corporation, Armonk, N.Y.

[22] Filed: Oct. 20, 1975

[21] Appl. No.: 623,878

[30] Foreign Application Priority Data

Nov. 20, 1974  United Kingdom ......... 0050342/74

[52] U.S. Cl. .................................. 357/68; 357/45; 357/52; 357/55; 357/70
[51] Int. Cl.² ................. H01L 27/10; H01L 29/34; H01L 29/06; H01L 23/48
[58] Field of Search .................. 357/45, 52, 55, 68, 357/70

[56] References Cited

UNITED STATES PATENTS

| | | | |
|---|---|---|---|
| 3,748,548 | 7/1973 | Haisty et al. | 357/45 |
| 3,947,840 | 3/1976 | Craford et al. | 357/45 |

OTHER PUBLICATIONS

IBM – Tech. Bul. — vol. 15, No. 2, July 1972, Bodendorf et al., pp. 656–657.

*Primary Examiner*—Edward J. Wojciechowicz
*Attorney, Agent, or Firm*—Robert J. Haase

[57] ABSTRACT

A power bus element for use in large scale integrated circuits is described. Each bus element consists, for example, of a chip of silicon having two levels of metallization thereon, one acting as an earth (or ground) return plane and the other providing power voltages. Dependent contacts on the chip make selective contact with metallization over the surface of the semiconductor wafer on which the chip is mounted. A power distribution line consists of a number of such bus elements linked together.

12 Claims, 12 Drawing Figures

C = 5 μF
C1 = 3.6 pF
C2 = 5.6 pF
C3 = 500 pF
C4 = 8 pF
C5 = 4.5 pF
C6 = 14.5 pF

L1 = 0.225 nH
L2 = 0.005 nH
L3 = 0.049 nH
R1 = 150 mΩ
R2 = 10.6 mΩ
R3 = 50 mΩ
R4 = 40.5 mΩ
R5 = 520 mΩ

SEMICONDUCTOR INTEGRATED CIRCUIT DEVICES

BACKGROUND OF THE INVENTION

The present invention relates to a semiconductor integrated circuit device and to a power distribution bus for a semiconductor integrated circuit device.

In the semiconductor art, there has been a substantial increase in processing yields in recent years due to increased understanding and control of the various processes necessary to form semiconductor devices. This has lead to increasingly more complex semiconductor integrated circuit devices and indeed at the present time it is not unusual for an individual semiconductor chip to contain well over 12,000 semiconductor devices.

It can be expected that in the not too distant future, attempts will be made to manufacture even more complex circuits. Essentially this is because the manufacture of many thousands of devices is just as cheap as the manufacture of one from a processing point of view. It is anticipated that soon the major component of the cost of an integrated circuit will be the packaging cost. Therefore intense efforts are being made to package more and more semiconductor devices into a single package.

Thus it has been proposed that instead of using individual chips of semiconductor material (for example 5 mm square) mounted in a package, use is made of a complete wafer of semiconductor material (for example from 25 to 75 mm in diameter). Such an approach could indeed save much of the packaging cost if process yields can be satisfactorily maintained. Co-pending U.S. application Ser. No. 367,093, filed June 4, 1973 in the name of Joseph C. Logue for "Method of Manufacturing Multi-Function LSI Wafers", and assigned to the present assignee describes a large scale integrated circuit in which, during manufacture two sets of wafers are produced, one being the mirror image of the other. The wafers are divided into two groups, one that has "mainly good" circuits and the other with "mainly bad" circuits. If a circuit in a wafer of the "mainly good" set is defective, it is electrically isolated and a mirror image replacement circuit from a "mainly bad" set is mounted over it. Because it is a mirror image, the input/output pads of the "flipped" replacement circuit coincide with the input/output pads of the isolated defective circuit.

One major problem associated with packaging a semiconductor wafer, which may contain a complete data processor, is the power distribution within the wafer. Generally, although conductive paths formed on or in the surface of the wafer are adequate as conductors for signals, they can in some circumstances have the inadequate thickness or width for carrying power to the various devices formed in the wafer.

SUMMARY OF THE INVENTION

According to one aspect of the present invention, a semiconductor integrated circuit device comprises a semiconductor integrated circuit device comprising a semiconductor substrate containing a plurality of integrated circuits arranged in two rows defining therebetween a channel, each circuit having associated therewith terminals for the supply of electrical power to that circuit, a plurality of conductive power feeding paths formed on the substrate and each extending from a terminal to a contact area in the channel, and a power bus passing along the channel and consisting of at least one power distribution element mounted on the substrate, each distribution element having dependent contacts bonded to selected ones of said contact areas, and each element comprising an earth return conductor and a voltage supply conductor electrically separated from one another by a layer of dielectric material.

According to a second aspect of the invention, a power distribution bus for a semiconductor integrated circuit device comprises at least one power distribution element having dependent contacts adapted to contact selected ones of a plurality of power feeder paths formed on the integrated semiconductor device when the element is mounted thereon, said power distribution element comprising an earth return conductor and a voltage supply conductor electrically isolated from one another by a layer of dielectric material.

BRIEF DESCRIPTION OF THE DRAWINGS

The invention will now be particularly described, by way of example, with reference to the accompanying drawings, in which.

DESCRIPTION OF THE PREFERRED EMBODIMENTS

Figure 1:
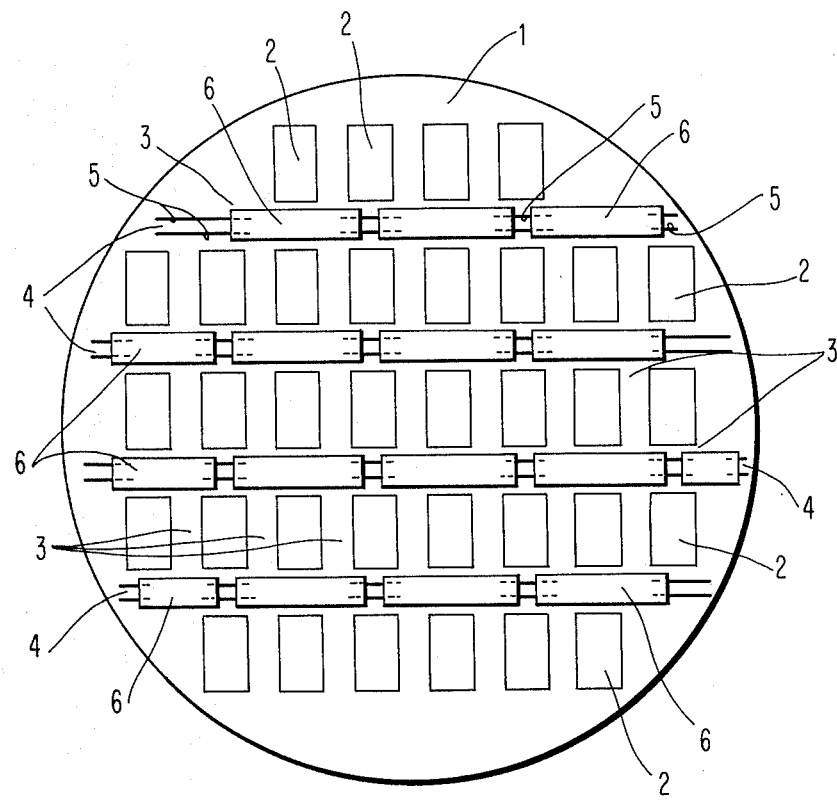
FIG. 1 is a schematic of a semiconductor wafer in plan view.

Referring now to FIG. 1, a wafer 1 of a semiconductor material such as silicon, has formed therein a number of islands or integrated circuits 2 arranged in rows and columns. Each integrated circuit consists of many thousands of individual semiconductor devices which are interconnected to constitute a particular circuit. Thus some of the circuits 2 may constitute arithmetic/logic units of a data processor while others may constitute memories. Each of the circuits 2 are electrically isolated from the other circuits except where they are electrically connected to other circuits by conductive paths, not shown, running over the surface of the wafer. Thus the whole wafer may constitute a complete data processor.

The wafer and its integrated circuits may be formed by any convenient technique in either field effect transistor (FET) technology or in bipolar transistor technology. No details are given in this description since these are not necessary to the understanding of the present invention.

Whatever the technology employed, the wafer surface is normally covered with a layer of insulating material such as silicon dioxide or silicon nitride which not only serves to protect the underlying semiconductor material and PN junctions but also serves as a support for conductive wiring which interconnects the various circuits and devices formed in the wafer. The amount of wiring will depend on the complexity of the circuits but normally will consist of two or three levels of metallurgy. In the present embodiment, the wafer has three levels of metallurgy of which reference will be made later.

Electrical interconnections within a circuit 2 are formed on the wafer surface within the boundaries of that circuit. The channels 3 formed between the rows and columns of circuits 2 are reserved for electrical interconnections, not shown, between different ones of the circuits 2 and to and from the input and output pins or pads (not shown) of the wafer. It will be appreciated by those skilled in the art that as well as using metallized paths over the surface of the wafer for the various interconnection, highly doped conductive paths can also be formed within the surface of the wafer. Since such structures are well known in the art and do not form part of the present invention, no details will be given. Suffice it to say, however, that if such conductive channels are desired, they could be formed in the wiring channel 3 between the islands 2.

One of the major problems associated with packaging a large scale integrated circuit is the distribution of power within the wafer. Generally speaking, metallurgy thickness and conductive widths are inadequate to cope with the currents envisaged and/or the resultant voltage drops between different areas on the wafer. Another problem in the impracticability of deriving any decoupling capacity on the wafer.

As mentioned above, manufacturing yields from the various semiconductor are increasing all the time. However, for the forseeable future it will be necessary to provide some degree of redundancy within the wafer which means that discretionary power connections will be needed to connect to the good devices or circuits.

The present invention mitigates these problems by providing a novel power distribution or power bus system. Referring once more to FIG. 1, a number of power busses 4 are formed over the wafer 1 along the wiring channels 3 between the circuits 1. Each power bus 4 consists of sections of metallized paths 5 connected together by bus chips 6.

Figure 2:
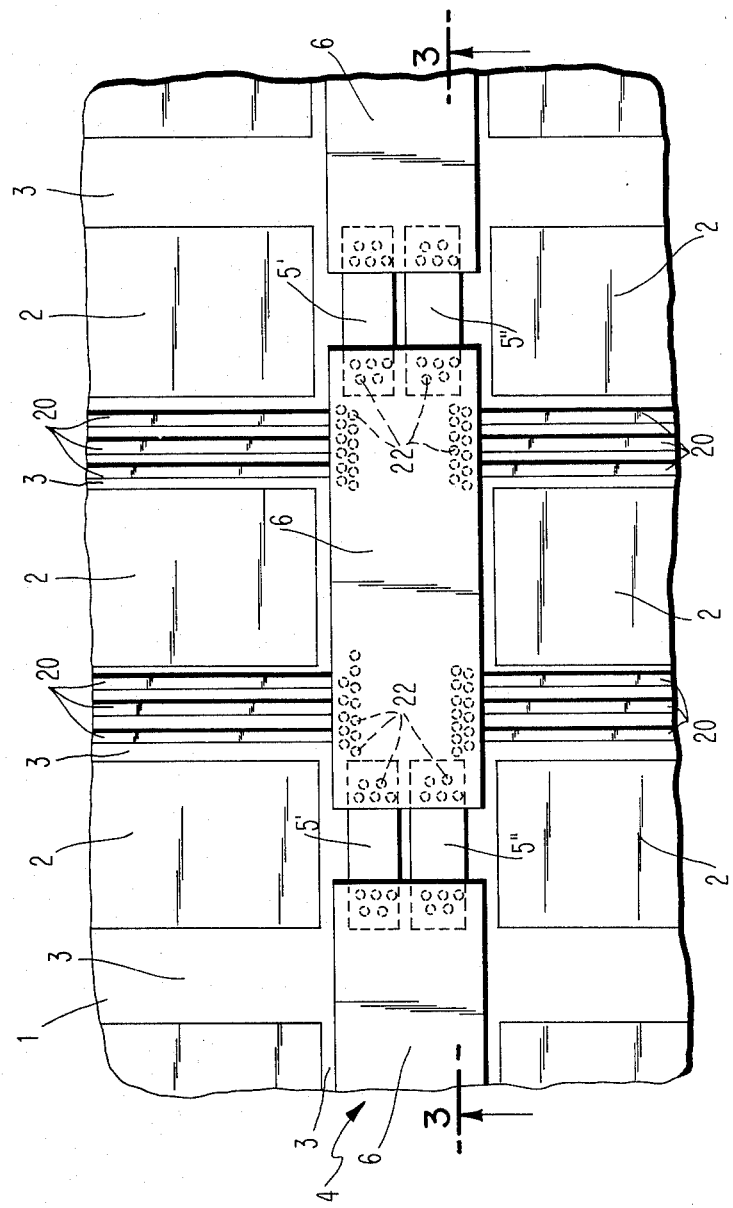
FIG. 2 is an enlarged view of part of the wafer shown in FIG. 1.
Figure 3:
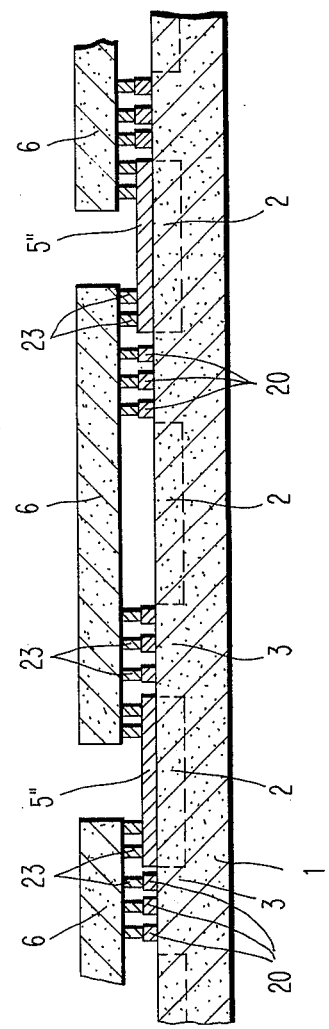
FIG. 3 is a cross-sectional view along the line III — III of FIG. 2.

This will be seen more clearly in FIGS. 2 and 3 which are an enlarged plan view and a cross-sectional view respectively of part of the wafer shown in FIG. 1. In its simplest form, each power bus 4 will consist of sections of wiring 5' connected to a particular voltage supply and of wiring 5'' connected to the earth or ground return. The bus chip 6, which interconnects the wiring sections 5'—5' and 5''—5'', consists of at least two levels of metallurgy separated by a layer of insulation.

Figure 4:
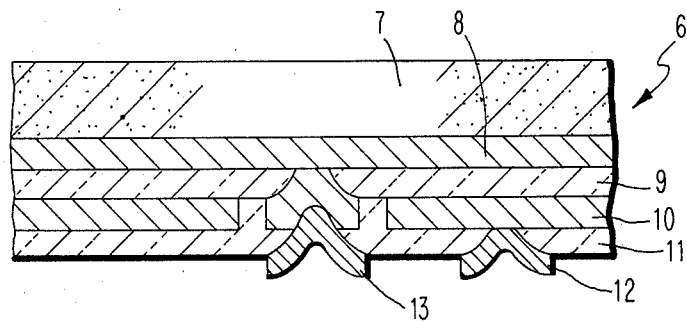
FIG. 4 is a cross-sectional view through a bus chip showing one form of construction.

Referring now to FIG. 4, which is a cross-section through one form of bus chip 6, a support 7 of silicon has a layer 8 of aluminum formed thereon by any convenient method such as by vacuum deposition. Aluminum layer 8 can serve as an earth or ground plane for the power bus. Formed over the aluminum layer 8 is a layer 9 of insulation material such as silicon dioxide which may be formed by sputtering. A second layer 10 of aluminum is formed over the insulating layer 9 and this in turn is covered by a final layer 11 of insulation material such as silicon dioxide which serves to protect the aluminum layer 10.

Figure 12:
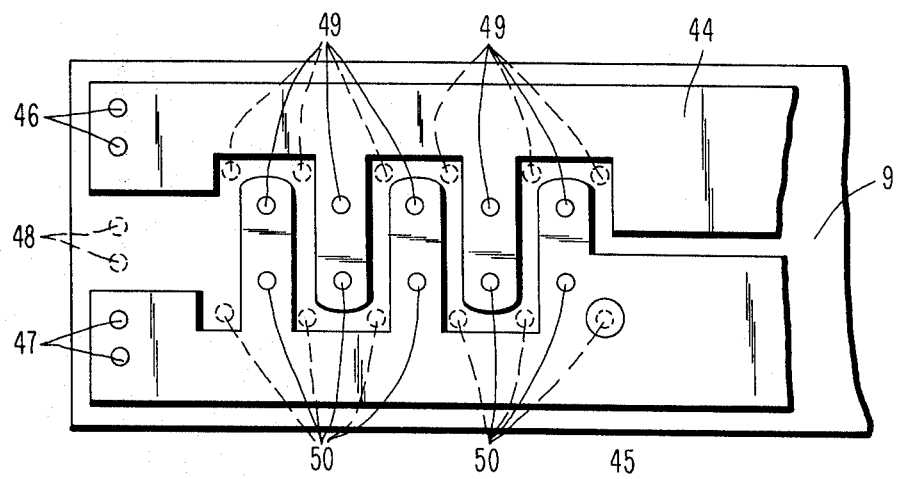
FIG. 12 is a plan view of part of a conductive plane of a bus chip.

In its simplest form, layer 10 may carry only one voltage but in practice it may be divided up into a number of separate metallization paths each carrying a particular voltage. An example of the latter is shown in FIG. 12. Contact pads 12 and 13 make contact with aluminum layers 10 and 8 respectively. Clearly, if layer 10 contains a number of conductive paths, each will need its own contact pad. If a large number of voltage levels are required, more than two metallization levels may be employed: however this would suffer from a drawback that complications would arise due to decoupling capacitor effects. The apertures in the various insulating and conductive layers can be made by conventional photolithographic techniques.

FIG. 12 shows how the layer 10 may be adapted to carry two different voltage levels. The layer comprises two regions of metallization 44 and 45 formed on the insulating layer 9. Associated with the regions 44 and 45 are contact areas 46 and 47 respectively whose purpose is to allow connection between the regions 44 and 45 with their associated link conductors formed on the wafer. Contact to the underlying ground or earth return plane can be made through contact zones 48. Contact zones 49 contacting the ground return plane and regions 44 allow 6 earth or ground connections, 3 first level voltage connections and 2 second level voltage connections to be made to one set of power feeder lines 20 (FIG. 2). Similarly contact zones 50 allow 6 earth or ground connections, 3 first level voltage connections and 2 second level voltage connections to be made to another set of power feeder lines when the bus chip is mounted on the wafer.

Clearly more voltage connections can be provided by forming the layer 10 with a more extensive interdigital arrangement of metallized regions.

Silicon is preferred as the substrate 7 since when used with a silicon wafer there will be no problems due to thermal mismatch. However, other supports can be used: indeed the silicon support 7 and ground plane 8 can be replaced by a single support of conductive material.

Many bus chips can be made from a wafer of silicon, each chip typically having dimensions of 6 mm wide by 13 mm long. Since the wiring on the bus chip carries only power and not logic or other signals, no compromise need be made as to conductor thickness etc. Those skilled in the art will recognize that the bus chip 6 can take various forms and can be made in various ways.

Figure 5:
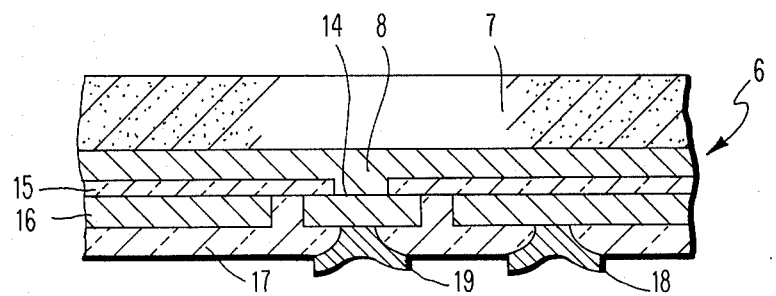
FIG. 5 is a cross-sectional view through a bus chip showing an alternative form of construction.

FIG. 5 illustrates a preferred form which is particularly convenient to fabricate. As was the case with the arrangement shown in FIG. 4, a substrate 7 of silicon carries a layer 8 of aluminum. Except for an area 14 to which a subsequent electrical connection is to be made, the surface of aluminum layer 8 is anodized to form an insulating layer 15 of aluminum oxide. A layer 16 of aluminum is formed over the oxide layer 15 and a final insulating layer 17 is formed over aluminum layer 16. Preferably layer 17 is of silicon dioxide deposited in any convenient manner or alternatively may be formed by the selective anodization of layer 16. Contact pads 18 and 19 complete the structure.

Returning now to FIGS. 2 and 3, the metallization links 5 are formed on the top insulated surface of wafer 1. At the same time, power feeder links 20 are formed on the top surface to distribute power from the power bus 4 to the integrated circuit islands 2. Metallization 5 and 20 constitute the third level of metallization on the wafer 1.

Since the channels 3 also contain second, and possibly first, levels of metallization for signal distribution purposes, it may be desirable to take steps to reduce noise coupling effects between the power distribution links 5 and the underlying wiring. To this end, the links 5 shown in FIG. 2 may be replaced by C- shaped links 21 shown in FIGS. 6 and 7. To protect and passivate the metallization 5(21) and 20, the top surface of the wafer is covered with a layer of insulating material, not shown, for example of silicon dioxide. Apertures 22 are etched in the passivation layer to allow contact to be made to the underlying metallization.

The bus chip 6 is mounted on the wafer 1 as a flipped chip, contact areas on the chip 6 making electrical contact with contact areas on the wafer which are connected to the third level metallization through the apertures 22. A variety of chip-joining techniques may be employed. Thus contact may be made through minute metallic balls interposed and bonded between the contact areas on the chip 6 and the contact areas on the metallization 5 and 20.

Preferably however, the bus chips 6 are joined to the wafer using a controlled collapse solder reflow technique. Such a technique is described in detail in the complete specification of our U.S. Pat. Nos. 1,298,115, 1,159,979 and 1,143,815.

Briefly, and referring to FIG. 3, the contact areas on the underside of chip 6 are provided with solder pads, for example by evaporation, as are the contact areas of the metallization 5 and 20 when it is desired to connect these together. If it is desired not to connect particular contact areas, no solder pads would be provided. The chip 6 is then positioned over the wafer 1 with the contact areas in register. The assembly is heated, for example by placing it in an oven or by directing hot gas at the chip, to cause the solder to melt. Surface tension effects cause the molten solder to support the chips 6 and to position them accurately with respect to the wafer 1. The assembly is cooled to bond the chips 6 to the wafer 1 by solder bonds 23. It will be apparent that the number of contact areas to be joined at each chip will depend on the number of voltage feeders 20 and the number of metallization links 5 (these in turn depend basically on the number of voltage levels to be supplied to the integrated circuit islands). To prevent undesirable current crowding at the contact areas, it may be necessary to use more than one contact area on each feeder 20 or on each link 5.

Figure 7:
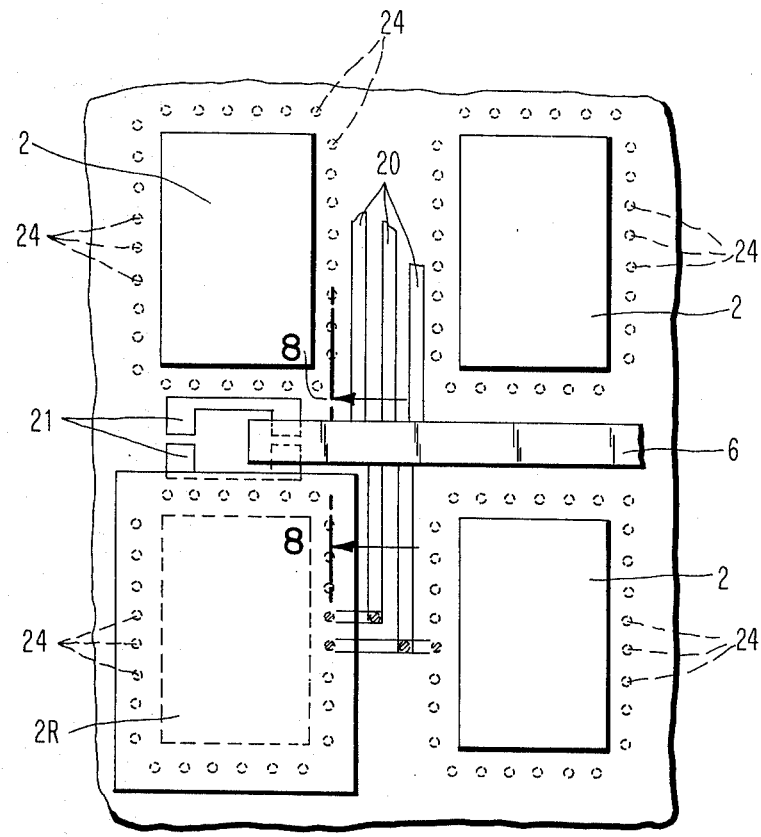
FIG. 7 is a plan view showing how power connections can be made to integrated circuits in the wafer.
Figure 8:
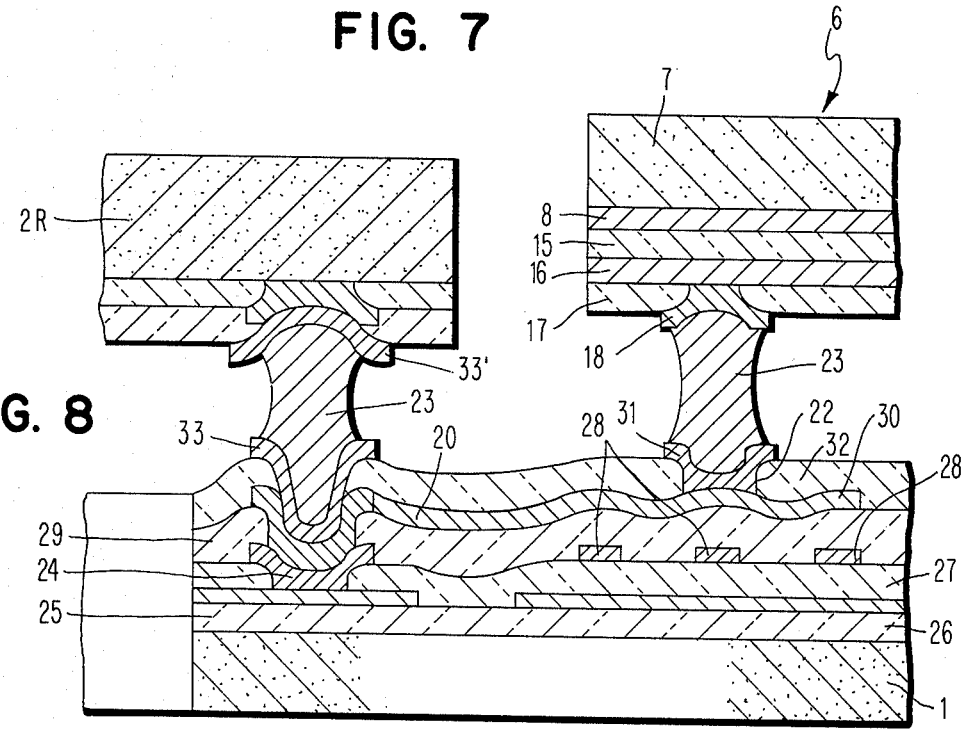
FIG. 8 is a cross-sectional view through a wafer, replacement circuit chip and bus chip.

FIG. 7 is a plan view showing the arrangement described above the more detail, except that the contact areas on the bus chip 6 have been omitted from the drawing for reasons of clarity. FIG. 8 is a cross-sectional view along the line VIII-VIII of FIG. 7 and serves to illustrate the various levels of metallization. Referring now to FIG. 7, part of a power distribution bus constituted by C shaped metallization links 21 and a bus chip 6 is located between the rows of integrated circuit islands 2. Feeders 20 feed power from contact areas, not shown, beneath chip 6 to the circuit islands 2. As can be seen more clearly with reference to FIG. 8, feeders 20 are constituted by the third level of metallization of the wafer 1.

Located around the circuit islands 2 are their input-/output pads 24 which form part of the second level of metallization of the wafer 1. To illustrate how the bus chip technique is compatible with the replacement chip technique mentioned above, replacement chip 2R is shown mounted on the wafer to replace an integrated circuit island 2 which was defective. This chip replacement technique is described in detail in the aforementioned application Ser. No. 367,093 but briefly replacement chip 2R is a mirror image of the island 2 which it is to replace (note that it is shown in a simplified form in the drawing). Thus, when it is inverted and mounted as shown, its contact areas are in register with the contact areas on the wafer 1.

Conveniently, the replacement chip 2R and bus chips 6 are joined to the wafer simultaneously by a controlled collapse solder reflow technique which will now be described with reference to FIG. 8. Wafer 1 is shown covered with a layer 25 of dielectric material, for example silicon dioxide, which serves to protect the surface of the wafer and also supports first level metallization 26, for example of aluminum. Metallization 26 will, of course, make contact with the wafer at various positions determined by apertures, not shown, in the layer 25. A second layer 27 of dielectric material covers the first level metallization 26. Upon the dielectric layer 27 is second level metallization 28 which includes input-/output pad 24. In the particular arrangement shown in FIG. 8, pad 24 is connected to the first level metallization externally of the island 2. It will be appreciated however that such connection could be made inside the island 2.

Metallization 28 is covered with a layer 29 of dielectric material which carries a third level of metallization 30 on its surface. The third level of metallization 30 includes the links 5 (not shown in FIG. 8) and feeders 20, one of which is shown connecting an input/output pad at contact area 31. The assembly is covered with a final layer 32 of dielectric material which protects the assembly from corrosion. The various levels of metallization 26, 28, 30 and the various dielectric layers 25, 27, 29, 32 can be formed by any convenient technique as can the apertures which are needed in the layers. Normally the metallization will be aluminum and the dielectric layers will be silicon dioxide.

Contact 31 for bus chip 6 and contact 33 for replacement chip 2R may be either a single layer of metal or a composite layer of metal. The exposed surface is such as to be wettable by a particular solder 23 being used. The contact 18 on chip 6, the contact 33' on chip 2R and the contact 31 and 33 on the wafer 1 are each coated with a layer of solder, for example by evaporation. The chips 6 and 2R are placed over the wafer 1 with a small amount of flux applied to each contact. The chips are then subjected to a solder reflow operation. Since the molten solder wets the contacts but at the most only partially wets the surrounding area, surface tension effects cause the molten solder to support the chips. As the assembly is cooled, the solder solidifies to form solder bonds 23 between the chips and the wafer. Slight misalignment may be corrected while the solder is molten due to surface tension effects.

Figure 9:
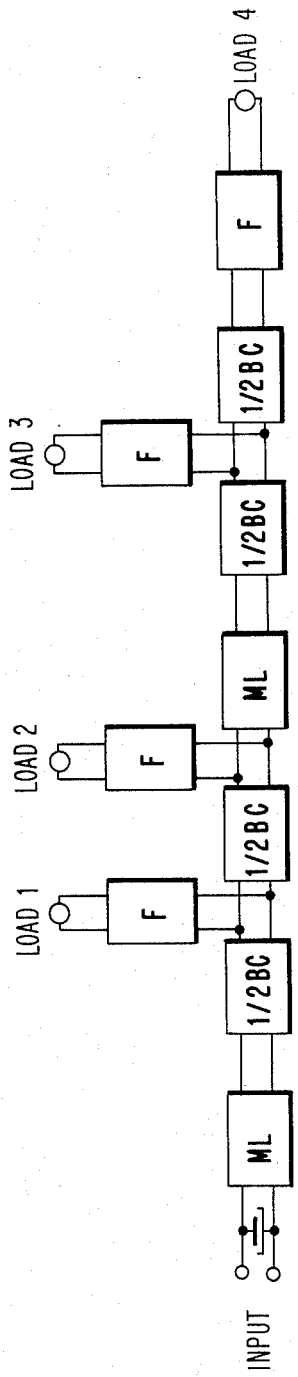
FIG. 9 shows a block diagram of a typical power bus distribution system.

FIG. 9 is a block diagram representing a power bus 4 on the wafer. Loads 1 to 4 represent various circuit islands, blocks ML each represent metal links 5 or 21, blocks 1/2BC each represent half of a bus chip 6, and blocks F each represent the feeders 20 from the bus chips to the circuit islands.

Figure 6:
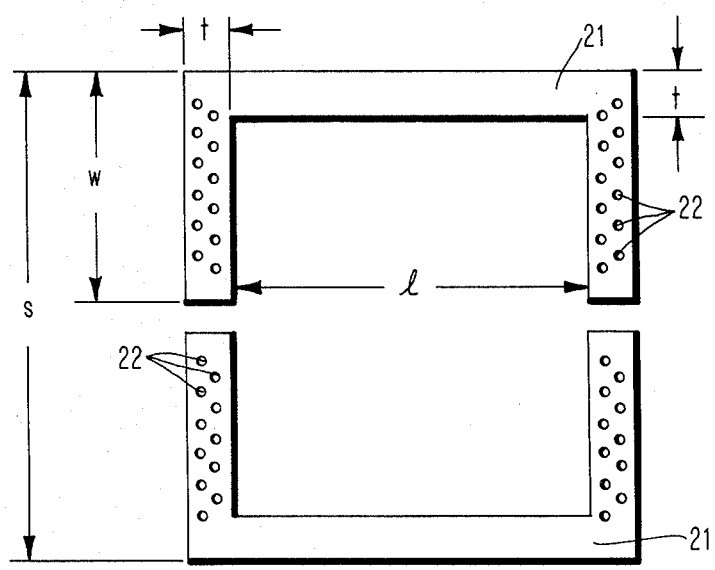
FIG. 6 shows an alternative shape for a length of power bus wiring.
Figure 10:
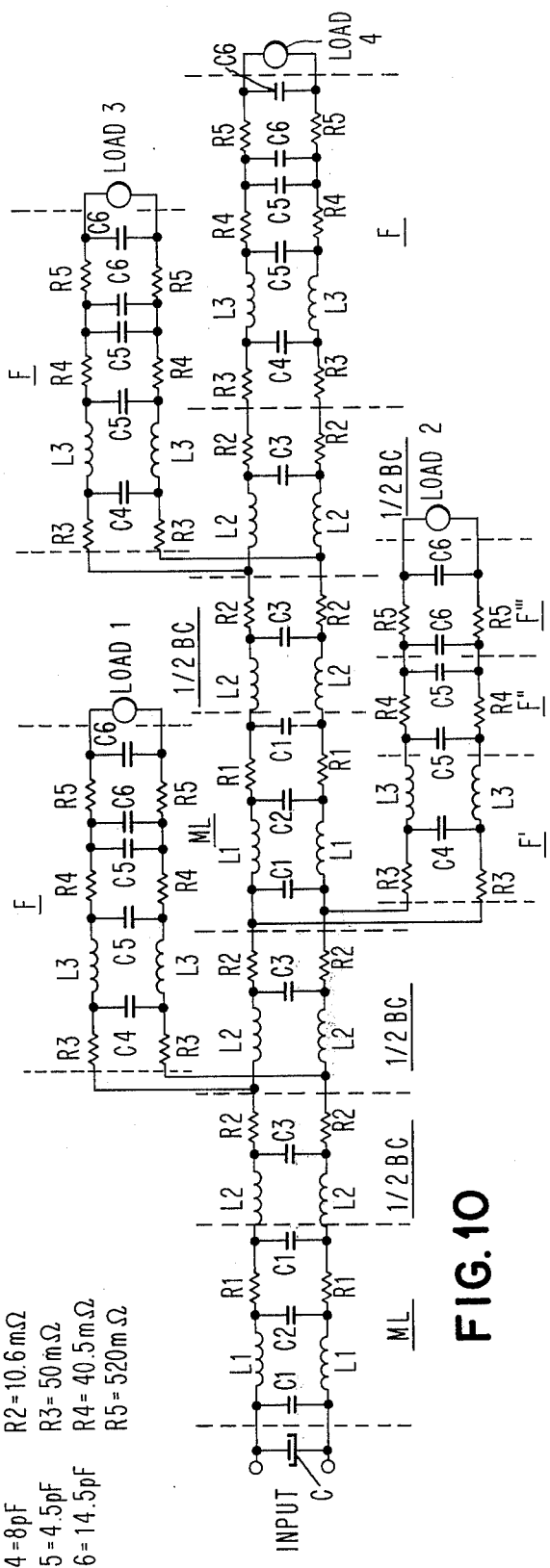
FIG. 10 shows the equivalent circuit of the power distribution system shown in FIG. 7.

FIG. 10 is an equivalent circuit diagram showing various values of resistance, inductance and capacitance for a particular configuration of power distribution bus. Within each feeder F, section F' represents the link from the power bus pads to through holes on the third layer of metallization, F'' represents the connection on the first level of metallization to the island, and F''' represents the metallization within the island. The particular circuit values shown are for example only and are those obtained when each bus chip consists of a 0.25 inch × 0.525 inch (6.35 mm × 13.335 mm) silicon chip in which is deposited two aluminum layers each 0.25 inch by 0.5 inch (6.35 mm × 12.7 mm) in area separated by 0.00025 inch (6.35 $\mu$) of aluminum oxide, the aluminum layers having a resistivity of 10 m $\Omega$/square. The connecting links are assumed to be C-shaped as shown in FIG. 6 with the dimensions S 0.25 inch (6.096 mm), W 0.1 inch (2.54 mm), L 0.14 inch (3.556 mm) and T 0.010 inch (0.254 mm) again with a sheet resistivity of the metallization equal to 10 m $\Omega$/square. At the edge of the wafer, the connecting link is assumed to have a width of 0.1 inch (2.54 mm) and a length of 0.15 inch (3.81 mm). The feeder links are assumed to have a width of 20 mil (0.508 mm) and a length of 0.1 inch (2.54 mm) from the bus chip pad to the island connection. The connection between the island connection and the edge of the island is assumed to be 27 mils (0.6858 mm) long with a width of 20 mils (0.508 mm).

Since the power bus described can be regarded as a transmission line, it is particularly suitable for use in integrated circuits which are pulse powered rather than having a constant DC potential applied thereto. The choice of insulator on the bus chips for separating the two metallizations should be aimed at creating the highest possible capacitance between the two levels of metallization. As indicated above, aluminum oxide is a good choice although glass, silicon dioxide, barium titanate and other dielectrics are suitable.

Although a wafer has been described in which a complete circuit island has been replaced by a replacement chip, it will be apparent that to overcome some of the manufacturing yield problems, some redundancy may be built into the circuit islands. Discretionary powering of the islands would then be necessary and this is easily available with the distribution systems described above.

Thus, the power feeders 20 may be formed in the channels and connected to every possible input/output pad around the island 2 which may require power to be applied thereto. However unselected feeder links are not connected to the bus chips 2 by not providing solder connections between undesired combinations of the contact areas 18 and 31, FIG. 8.

The power bus chips 6 illustrated each supply power to four integrated circuit islands 2. It will be apparent that by lengthening the chips, they can span more islands 2 and supply power to six or eight circuit islands. The limit on the number of islands to be fed from each bus chip is determined by the practicality of fabricating and handling the longer bus chips.

The bus chips have an inherently low inductance because the voltage and ground return conductors are within 5 to 10 $\mu$ m of each other depending upon the thickness of the insulator used. Additionally, since thicker metallurgy can be used than would normally be possible on the wafer, there is only a low voltage drop along the bus chips. Furthermore the chip metallurgy can be of large area to reduce resistance without running into the pinhole problems inherent in large area metallurgy on wafers. It will also be apparent that the use of bus chips achieves distributed decoupling, each bus chip acting as a capacitor: with a 10 $\mu$ m aluminum oxide insulation layer, a capacitance of 960pF is possible.

Figure 11:
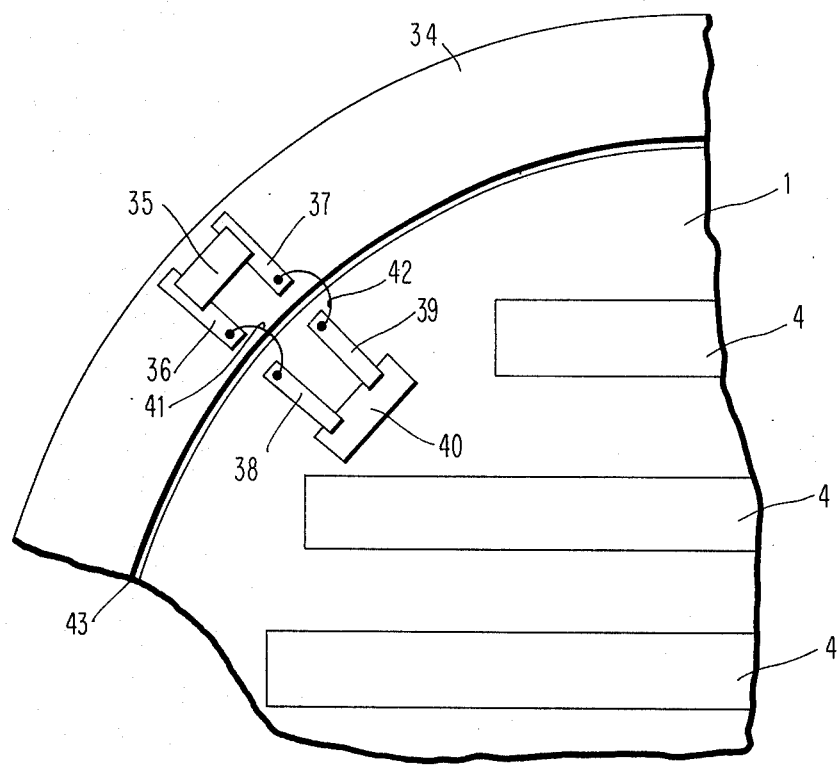
FIG. 11 shows how connections may be made to the wafer at its periphery.

FIG. 11 illustrates how a completed wafer 1 may be mounted on an annular mount 34. A decoupling chip capacitor 35 (for example 5 $\mu$ f) is connected between metallized conductive paths 36 and 37 on mount 34. Conductive paths 38 and 39 on wafer 1 are connected to peripheral circuits 40 which may include current drivers etc. for supplying power to the power distribution networks 4. Flying wires or decals 41 and 42 connect paths 36 and 37 to paths 38 and 39 respectively across gap 43 between wafer 1 and mount 34.

What has been described is a very flexible power distribution network which can be tailored to suit the particular power requirements of the integrated circuit. By using bus chips, the power supply conductors can be placed within close proximity to the ground or earth return conductor for a major part of the distribution network.

What we claim is:

1. A semiconductor integrated circuit device comprising a semiconductor wafer containing a plurality of integrated circuit islands arranged in rows defining therebetween channels, said channels providing pathways for electrical signal interconnections between circuit islands, each circuit island having associated therewith terminals solely for the supply of electrical power thereto, a plurality of conductive power feeding paths formed on the substrate and each extending from one of said terminals to a contact area in one of said channels, and a power bus passing along the channel over said electrical signal interconnections and consisting of at least one power distribution element mounted on the substrate, each distribution element having contacts bonded to selected ones of said contact areas, and each element comprising an earth return conductor and a voltage supply conductor electrically separated from one another by a layer of dielectric material.

2. A device as claimed in claim 1, in which the integrated circuits are arranged in more than two rows, in which a power bus extends along each channel between the rows, and in which the terminals of said integrated circuits are connected by said conductive feeding paths to contact areas located within the channel adjacent the respective circuit.

3. A device as claimed in claim 1, in which each power bus comprises a plurality of power distribution elements mounted end to end, electrical connections between adjacent elements being made by conductive paths formed on the substrate and extending along the channel between contacts located on the ends of the elements.

4. A device as claimed in claim 3, in which the conductive paths between the elements are shaped to minimize noise effects between them and signal conductors formed in the channel beneath the conductive paths.

5. A device as claimed in claim 1, in which each distribution element spans at least two integrated circuits.

6. A device as claimed in claim 1, wherein the contacts of each element are bonded to selected ones of the contact areas by a controlled collapse bonding technique.

7. A device as claimed in claim 1, in which distribution element comprises a chip of semiconductor material, a first layer of metal formed on the semiconductor chip, a layer of said dielectric material covering the first metal layer, and a second level of metal formed over the dielectric layer.

8. A device as claimed in claim 7, wherein the semiconductor material is silicon, and the first metal layer is aluminum.

9. A device as claimed in claim 8, wherein the dielectric is aluminum oxide formed by anodizing the surface of the layer of aluminum.

10. A device as claimed in claim 7, wherein the dielectric material is silicon oxide or barium titanate.

11. A device as claimed in claim 7, wherein the second level of metallization comprises a number of distinct paths, each for supplying a different voltage level.

12. A device as claimed in claim 7, in which a final layer of dielectric material covers the second level of metal.

* * * * *